(12) United States Patent
Lovinggood (10) Patent No.: US 10,938,435 B2
(45) Date of Patent: *Mar. 2, 2021

(54) INRUSH CURRENT LIMITER CIRCUITS HAVING CURRENT REGULATING SWITCHES THEREIN

(71) Applicant: CommScope Technologies LLC, Hickory, NC (US)

(72) Inventor: Breck W. Lovinggood, Wylie, TX (US)

(73) Assignee: CommScope Technologies LLC, Hickory, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 16/692,307

(22) Filed: Nov. 22, 2019

(65) Prior Publication Data

US 2020/0091953 A1 Mar. 19, 2020

Related U.S. Application Data

(63) Continuation of application No. 16/210,023, filed on Dec. 5, 2018, now Pat. No. 10,523,260.

(Continued)

(51) Int. Cl.
*H04B 1/40* (2015.01)
*H03F 3/195* (2006.01)
(Continued)

(52) U.S. Cl.
CPC ............... *H04B 1/40* (2013.01); *H02H 9/001* (2013.01); *H03F 1/0211* (2013.01);
(Continued)

(58) Field of Classification Search
CPC .. H04B 1/40; H04B 1/1615; H04B 10/50575; H03F 1/0266; H03F 3/245; H03F 3/217;
(Continued)

(56) References Cited

U.S. PATENT DOCUMENTS 5,432,473 A 7/1995 Mattila et al.
6,111,464 A 8/2000 Laureanti
(Continued)

OTHER PUBLICATIONS

Notification of Transmittal of the International Search Report and the Written Opinion of the International Searching Authority, or the Declaration, in corresponding PCT Application No. PCT/US2018/063959 (dated May 14, 2019).

*Primary Examiner* — Andrew Wendell
(74) *Attorney, Agent, or Firm* — Myers Bigel, P.A.

(57) ABSTRACT

Base station antennas utilize RF transmitters and receivers, which operate with enhanced bias control to achieve very high speed switching during TDD operation. A radio frequency communication circuit for TDD includes a transmit/receive amplifier (e.g., MMIC) having first and second input terminals, which are responsive to a bias control voltage and radio frequency input signal. A bias control circuit is provided, which is electrically coupled to the first input terminal and a current receiving terminal of the transmit/receive amplifier. The bias control circuit includes a closed-loop feedback path between the current receiving terminal and the first input terminal, which is configured to regulate a magnitude of the bias control voltage with high precision to thereby achieve a substantially constant quiescent bias current at the current receiving terminal when the transmit/receive amplifier is enabled.

13 Claims, 6 Drawing Sheets

Related U.S. Application Data (60) Provisional application No. 62/609,725, filed on Dec. 22, 2017.

(51) Int. Cl.

| | | |
|---|---|---|
| *H03F 1/02* | (2006.01) | |
| *H02H 9/00* | (2006.01) | |
| *H03F 1/52* | (2006.01) | |
| *H03F 3/24* | (2006.01) | |
| *H03F 3/19* | (2006.01) | |
| *H03F 3/217* | (2006.01) | |
| *H04B 1/16* | (2006.01) | |
| *H04L 5/14* | (2006.01) | |

(52) U.S. Cl.
CPC ............ *H03F 1/0266* (2013.01); *H03F 1/52* (2013.01); *H03F 3/19* (2013.01); *H03F 3/195* (2013.01); *H03F 3/217* (2013.01); *H03F 3/245* (2013.01); *H04B 1/1615* (2013.01); *H03F 2200/129* (2013.01); *H03F 2200/156* (2013.01); *H03F 2200/21* (2013.01); *H03F 2200/264* (2013.01); *H03F 2200/441* (2013.01); *H03F 2200/451* (2013.01); *H04L 5/14* (2013.01)

(58) Field of Classification Search
CPC . H03F 3/19; H03F 1/52; H03F 1/0211; H03F 3/195; H03F 2200/451; H03F 2200/441; H03F 2200/156; H03F 2200/21; H03F 2200/129; H03F 2200/264; H04L 5/14; H02H 9/001
See application file for complete search history.

(56) References Cited

U.S. PATENT DOCUMENTS

| | | | |
|---|---|---|---|
| 6,150,802 A | * | 11/2000 | Andrews ............... G06F 1/3203 345/204 |
| 6,665,339 B1 | | 12/2003 | Adams et al. |
| 10,523,260 B2 | * | 12/2019 | Lovinggood ........... H03F 3/195 |
| 2003/0038676 A1 | | 2/2003 | Mages |
| 2003/0155978 A1 | | 8/2003 | Pehlke |
| 2009/0225062 A1 | * | 9/2009 | Naik ..................... G06F 1/3203 345/204 |
| 2011/0043278 A1 | | 2/2011 | Adams |
| 2013/0027129 A1 | | 1/2013 | Langer |
| 2014/0197890 A1 | | 7/2014 | Liou |
| 2014/0347130 A1 | | 11/2014 | Iijima et al. |
| 2015/0077187 A1 | | 3/2015 | Lam et al. |
| 2018/0083578 A1 | | 3/2018 | Klaren et al. |

\* cited by examiner

INRUSH CURRENT LIMITER CIRCUITS HAVING CURRENT REGULATING SWITCHES THEREIN

REFERENCE TO PRIORITY APPLICATIONS

This application is a continuation application of and claims priority to U.S. patent application Ser. No. 16/210,023 filed Dec. 5, 2018, which U.S. Provisional Patent Application No. 62/609,725 filed Dec. 22, 2017, the disclosures of which are hereby incorporated herein by reference.

FIELD OF THE INVENTION

The present invention relates to communications systems and, more particularly, to cellular communication systems and methods of operating same.

BACKGROUND

Figure 1A:
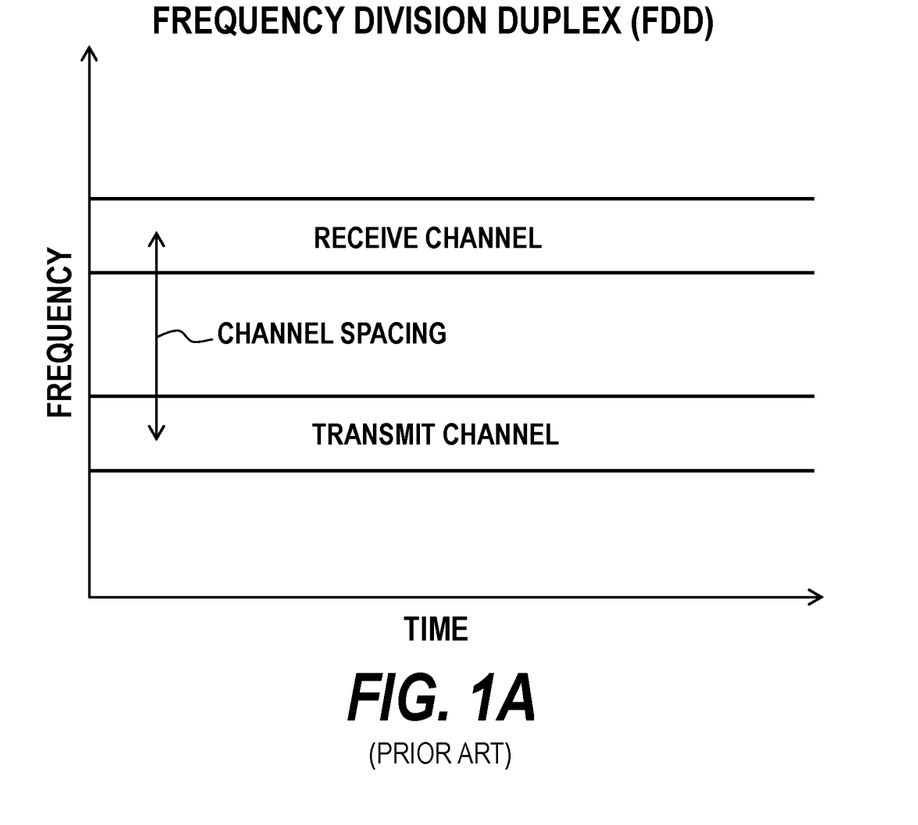
FIG. 1A is a diagram that illustrates how distinct transmit and receive radio channels, which are separated in frequency by a guard band, can be used to support two-way radio communication within a frequency division duplex (FDD) communication system.

The ultimate goal of many wireless providers of communication services is to combine high bandwidth data and video services into a single platform with more conventional and lower bandwidth voice services. To achieve this goal, more limited technologies associated with conventional voice dominated networks are being replaced with much newer and state-of-the-art technologies that support higher information bandwidths. Data transmission protocols such as Frequency Division Multiple Access (FDMA) and Frequency Division Duplex (FDD) were once highly innovative technologies when applied to traditional voice-only networks. FDD supports two-way radio communication by using two distinct radio channels. In a fixed wireless point-to-point system that uses FDD, one frequency channel is transmitted downstream from a radio "A" to a radio "B" and another second frequency channel is used in an upstream direction to support transmission from radio "B" to radio "A". Because of the pairing of distinct frequencies, simultaneous transmission in both the upstream and downstream directions is possible, so long as a sufficient amount of frequency separation (i.e., guard band) is maintained to limit self-interference. As shown by FIG. 1A, this guard band is illustrated as a channel spacing between adjacent channels, a transmit channel (left) and a receive channel (right).

FDD systems can be used for asymmetric downstream and upstream traffic when the downstream and upstream channel bandwidths are matched precisely to the asymmetry. Nonetheless, FDD systems are most suited for symmetric traffic applications in which the same or similar information flows in both directions, such as voice communications.

Fortunately, there are now newer technologies on the market that support the higher bandwidth demands and more dynamic nature of networks that deliver a combination of voice, video, internet and other data services more efficiently by supporting "bursty" and asymmetric traffic (e.g., Internet). For example, Time Division Duplex (TDD) uses a single frequency channel to transmit signals in both the downstream and upstream directions by transmitting the signals in different time "slots." TDD operates by toggling transmission directions (at high speed) over a time interval, which means that TDD can support voice and other symmetrical communication services as well as asymmetric data services, and can even support a dynamic mix of both traffic types. In addition, the relative capacity of the downstream and upstream links can be altered in favor of one direction over the other direction. This is easily accomplished by providing a greater time allocation through additional time slots to downstream (or upstream) transmission intervals relative to upstream (or downstream) transmission intervals. This asymmetric capability is useful for communication processes characterized by unbalanced information flow, such as when a relatively short upstream message prompts a large information download as is typical with Internet access.

Figure 1B:
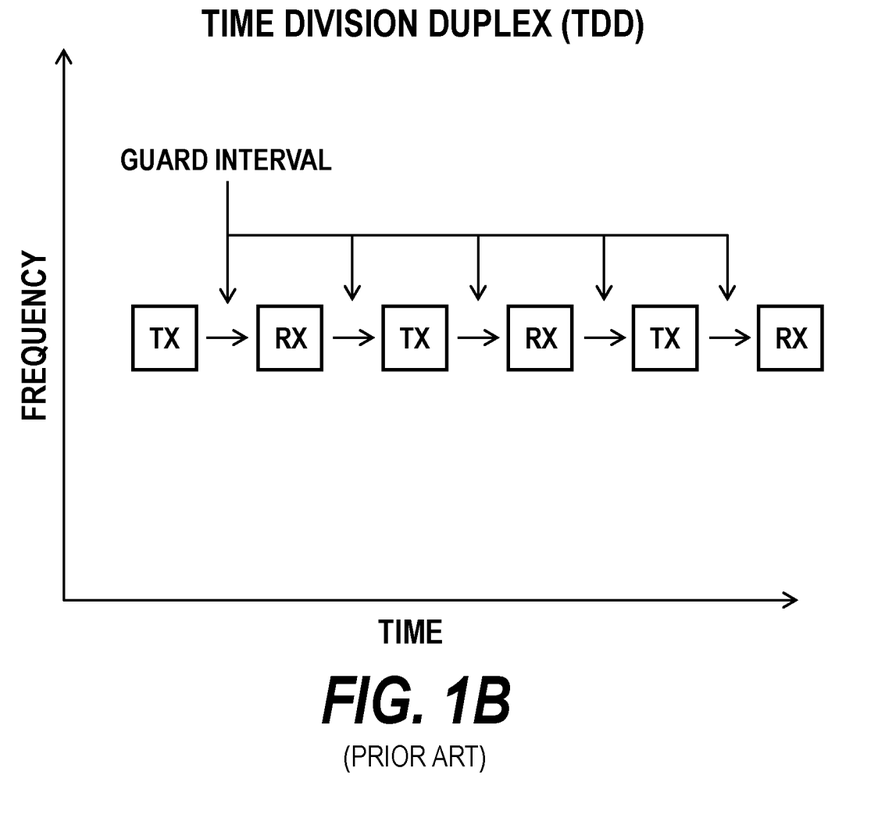
FIG. 1B is a diagram that illustrates how a single radio channel can be used to support two-way radio communication within a time division duplex (TDD) communication system.

To support the use of a single frequency channel, TDD systems require a guard time interval (instead of guard frequency band) between transmit and receive data streams, as shown by FIG. 1B. This guard time interval, which is often referred to as a TX/RX transition gap (TTG), enables a base station to switch from transmit mode to receive mode and subscribers to switch from receive mode to transmit mode. During this gap, the base station and subscriber are not transmitting modulated data but are simply allowing the base station transmitter carrier to ramp down, the TX/RX antenna switch to actuate and the base station receiver section to activate.

Moreover, because in TDD, both the transmitter and receiver operate on the same frequency band (but at different time intervals), TDD systems can reuse filters, mixers, frequency sources and synthesizers, which contrasts with FDD systems since in those systems the equipment operates at different frequencies. TDD can also support interference mitigation via proper frequency planning because TDD requires only one interference-free channel compared to FDD, which requires two interference-free channels.

SUMMARY OF THE INVENTION

Base station antennas according to embodiments of the invention utilize radio frequency (RF) transmitters and receivers to support time division duplexing (TDD) of RF signals. These RF transmitters and receivers operate with enhanced bias control to thereby achieve very high speed switching. According to some embodiments of the invention, a radio frequency communication circuit for time division duplexing is provided, which includes a transmit/receive amplifier having first and second input terminals, which are responsive to a bias control voltage and radio frequency input signal, respectively. This transmit/receive amplifier may be embodied as a monolithic microwave integrated circuit (MMIC), for example. A bias control circuit is also provided, which is electrically coupled to the first input terminal and a current receiving terminal of the transmit/receive amplifier. The bias control circuit may include a closed-loop feedback path between the current receiving terminal and the first input terminal. This closed-loop feedback path is configured to regulate a magnitude of the bias control voltage with high precision to thereby achieve a substantially constant quiescent bias current at the current receiving terminal when the transmit/receive amplifier is enabled.

According to some additional embodiments of the invention, the bias control circuit may include a "dual" reference voltage generator, which is responsive to an enable signal. This reference voltage generator is configured to selectively generate a first reference voltage at a reference terminal, which operates via the closed-loop feedback path to enable the transmit/receive amplifier, and a second reference voltage at the reference terminal, which operates via the closed-loop feedback path to disable the transmit/receive amplifier. The bias control circuit may also include an integrator (e.g., Miller integrator) within the closed-loop feedback path, which compares a reference voltage generated at the reference terminal to a feedback voltage derived from a voltage at the current receiving terminal of the transmit/receive amplifier. In some embodiments, this feedback voltage may be proportional to the voltage at the current receiving terminal of the transmit/receive amplifier.

According to additional embodiments of the invention, the bias control circuit may include a comparator within the closed-loop feedback path, which compares the reference voltage generated at the reference terminal to the feedback voltage derived from a voltage at the current receiving terminal of the transmit/receive amplifier. In particular, the bias control circuit may include a comparator within the closed-loop feedback path, which has a first input terminal electrically connected to the reference terminal of the reference voltage generator. In addition, the closed-loop feedback path may include a feedback voltage divider, which is connected to the current receiving terminal of the transmit/receive amplifier and is configured to generate the feedback voltage at a second input terminal of the comparator. In some of these embodiments, the feedback voltage divider may include first and second serially-connected feedback resistors, which match first and second serially-connected resistors within the reference voltage generator when the transmit/receive amplifier is enabled.

According to further aspects of these embodiments of the invention, the bias control circuit may be responsive to a control voltage at a control terminal thereof when the transmit/receive amplifier is enabled. In addition, the bias control circuit may include a comparator within the closed-loop feedback path. This comparator may have an output terminal electrically coupled by a first bias control resistor to the first input terminal of the transmit/receive amplifier. A second bias control resistor may also be provided, which electrically couples the control terminal of the bias control circuit to the first input terminal of the transmit/receive amplifier. Based on this configuration, the first and second bias control resistors will collectively operate as a bias control voltage divider when the transmit/receive amplifier is enabled. A parallel RC damping circuit may also be provided to stabilize high speed switching performance. This RC damping circuit is electrically connected between a first input terminal of the comparator and the output terminal of the comparator.

According to still further embodiments of the invention, an inrush current limiter may be provided, which is electrically coupled to the bias control circuit. This inrush current limiter may include a current regulating switch having first and second current carrying terminals and a control terminal, which is electrically coupled by a first impedance to the first current carrying terminal and by a second impedance to the second current carrying terminal. An enable switch may also be provided, which has a control terminal responsive to a current control enable signal and a first current carrying terminal electrically coupled by a third impedance to the control terminal of the current regulating switch. These first and third impedances may be collectively configured to operate as a voltage divider when the current control enable signal is active, yet clamp the current regulating switch in a current blocking state when the current control enable signal is inactive. In addition, the second and third impedances may be collectively configured to reduce a rate-of-change of a voltage at the control terminal of the current regulating switch when the current control enable signal is switched from inactive to active. In some embodiments of the invention, the current regulating switch is a P-channel transistor, the enable switch is an N-channel pull-down transistor, the first and third impedances are resistors and the second impedance is a capacitor having a first current carrying terminal electrically coupled to a drain of the P-channel transistor and a second current carrying terminal electrically coupled to a gate of the P-channel transistor.

According to further embodiments of the invention, an integrated circuit device is provided with an amplifier having first and second input terminals, which are responsive to a bias control voltage and data input signal, respectively. A bias control circuit is also provided, which includes a closed-loop feedback path extending between a current receiving terminal and the first input terminal of the amplifier. This closed-loop feedback path is configured to regulate a magnitude of the bias control voltage to achieve a substantially constant quiescent bias current at the current receiving terminal when the amplifier is enabled. This amplifier may be embodied as a monolithic microwave integrated circuit (MMIC) and the data input signal may be a radio frequency data signal.

According to additional embodiments of the invention, a bidirectional communication circuit is provided for time division duplexing (TDD). This circuit includes a radio frequency (RF) transmitter having first and second input terminals, which are responsive to a first bias control voltage and a first RF input signal, respectively. A first bias control circuit is also provided, which includes a first closed-loop feedback path extending between a current receiving terminal and the first input terminal of the RF transmitter. The first closed-loop feedback path is configured to regulate a magnitude of the first bias control voltage when the RF transmitter is enabled. In addition, a radio frequency (RF) receiver is provided with first and second input terminals, which are responsive to a second bias control voltage and a second RF input signal, respectively. A second bias control circuit is provided, which includes a second closed-loop feedback path extending between a current receiving terminal and the first input terminal of the RF receiver. The second closed-loop feedback path is configured to regulate a magnitude of the second bias control voltage when the RF receiver is enabled. In some of these embodiments of the invention, the RF transmitter and the RF receiver may be provided as respective monolithic microwave integrated circuits (MMICs).

In still further embodiments of the invention, an integrated circuit device is provided with an amplifier, which is embodied within a monolithic microwave integrated circuit (MMIC), and a bias control circuit, which is electrically coupled to the MMIC. This bias control circuit is configured to regulate a magnitude of a bias control voltage applied to the MMIC to thereby achieve a substantially constant quiescent bias current within the amplifier when the amplifier is enabled to amplify a radio frequency (RF) data signal. In some of these embodiments, the bias control circuit may include a reference voltage generator and a closed-loop feedback path containing a feedback voltage divider therein. In particular, the reference voltage generator may include a reference voltage divider, which is active when the amplifier is enabled. And, this reference voltage divider may be matched to the feedback voltage divider. The closed-loop feedback path may also include a comparator having a first input terminal electrically connected to a reference terminal within the reference voltage generator and a second input terminal electrically connected to an intermediate node of the feedback voltage divider. The bias control circuit may be responsive to first and second fixed-voltage signals at respective first and second terminals when the amplifier is enabled. The first terminal can be a power supply terminal and the second terminal can be electrically coupled by a bias control voltage divider to an output of the comparator.

Moreover, an intermediate node of the bias control voltage divider may be electrically connected to the first input terminal of the amplifier to thereby provide the bias control voltage thereto when the amplifier is enabled.

BRIEF DESCRIPTION OF THE DRAWINGS

The accompanying drawings, which are incorporated in and constitute a part of this specification, illustrate embodiments of the invention, where like reference numbers in the drawing figures refer to the same feature or element and may not be described in detail for every drawing figure in which they appear and, together with a general description of the invention given above, and the detailed description of the embodiments given below, serve to explain the principles of the invention.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components and/or regions, these elements, components and/or regions should not be limited by these terms. These terms are only used to distinguish one element, component and/or region from another element, component and/or region. Thus, a first element, component and/or region discussed below could be termed a second element, component and/or region without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Figure 2A:
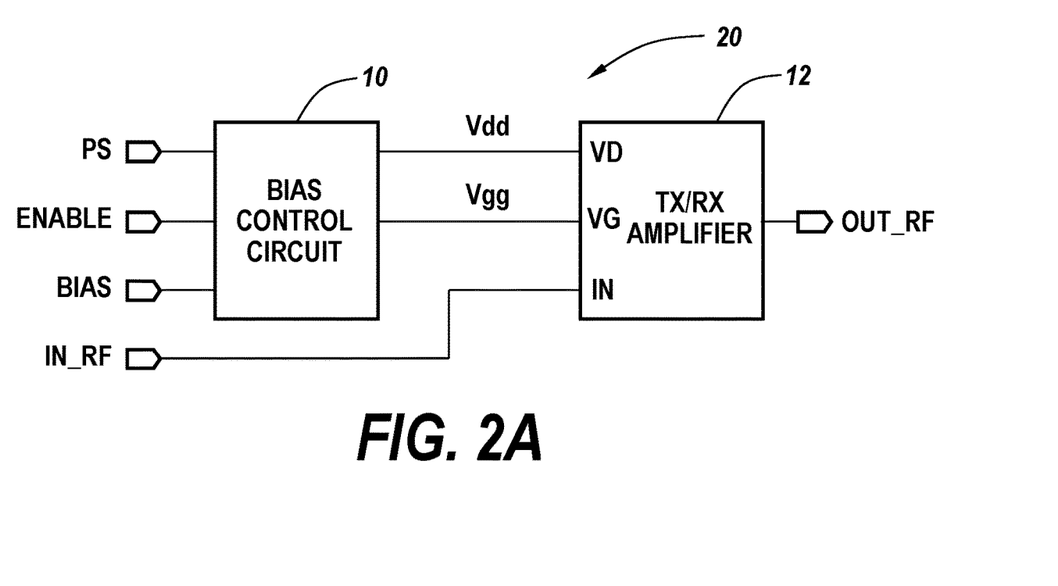
FIG. 2A is a block diagram of a radio frequency communication circuit according to an embodiment of the present invention, which may be used within a time division duplexing (TDD) communication system.
Figure 2B:
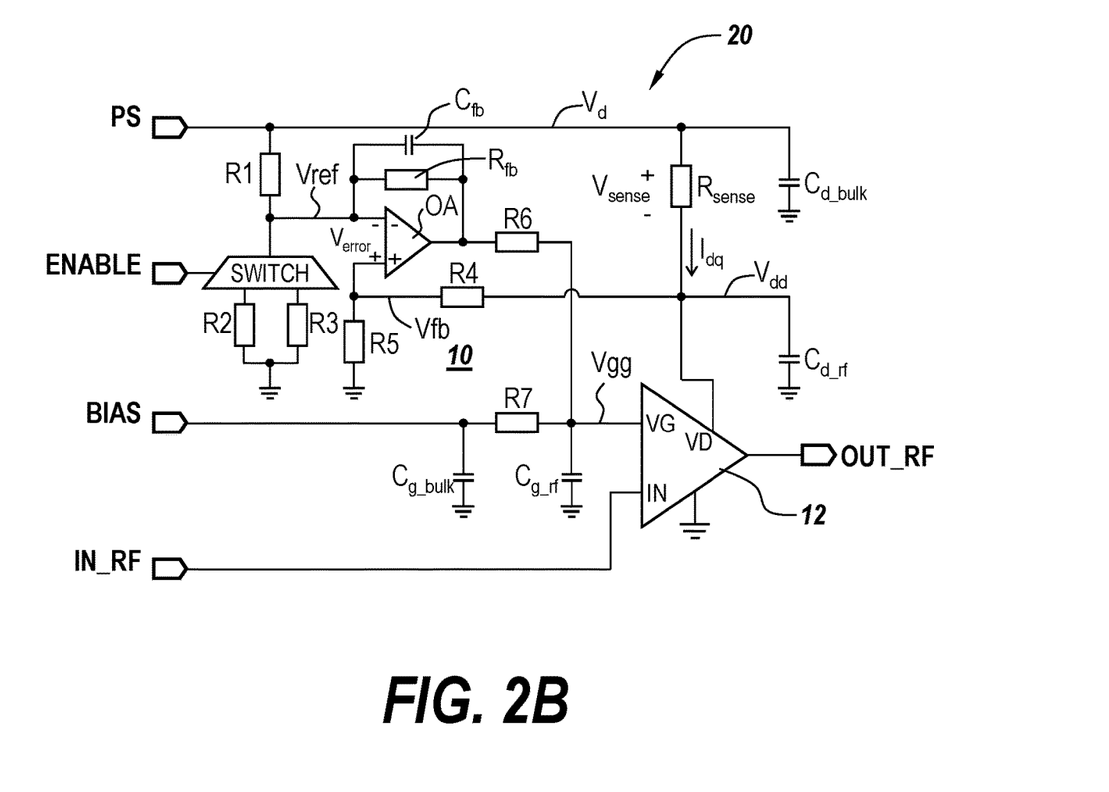
FIG. 2B is an electrical schematic of an embodiment of the radio frequency communication circuit of FIG. 2A, according to the present invention.

Referring now to FIGS. 2A-2B, a radio frequency communication circuit 20 for a time division duplexing (TDD) communication system is illustrated as including a transmit/receive amplifier 12 having a first input terminal (VG) and a second input terminal (IN) responsive to a bias control voltage (Vgg) and radio frequency input signal (IN_RF), respectively. As referred to herein, a "transmit/receive amplifier" designates an amplifier that may function as a transmitter amplifier or as a receiver amplifier. A bias control circuit 10 is also provided, which is electrically coupled to the first input terminal VG and a current receiving terminal (VD) of the transmit/receive amplifier 12. As shown, this bias control circuit 10 is responsive to a power supply signal (PS), a bias control reference signal (BIAS) and a binary "on/off" enable signal (ENABLE), at respective terminals thereof. In order to address the often challenging biasing requirements associated with the amplifier 12, which may be configured as a gallium arsenide (or gallium nitride) power transmitter amplifier (PA) or a low noise gallium arsenide (or gallium nitride) receiver amplifier (LNA), "drain" voltage turn on at the current receiving terminal (VD) should typically be delayed until the bias control voltage Vgg is stable, to thereby prevent damage to the amplifier 12. Moreover, in this TDD communication system, it is typically desirable to turn off the receiver amplifier when the system is transmitting (e.g., PA is on), and turn off the transmitter amplifier when the system is receiving (e.g., LNA is on). In millimeter wave TDD communication systems (e.g., 25-300 GHz), the turn-on/turn-off timing is a critical parameter. In alternative embodiments of the invention, the amplifier may be configured using silicon, LDMOS or SiGe technology, for example.

As shown by FIG. 2B, the bias control circuit 10 includes a closed-loop feedback path extending between the current receiving terminal VD (via node Vdd) and the first input terminal VG of the transmit/receiver amplifier 12. This closed-loop feedback path includes a feedback voltage divider (R4, R5), a high speed operational amplifier (OA) with parallel RC damping circuit (Cfb, Rfb), and a bias control voltage divider (R6, R7), which generates the bias control voltage Vgg at an intermediate node thereof and at the first input terminal VG. The operational amplifier OA, which operates as a comparator and is responsive to a variable reference voltage Vref, may be configured as a high performance voltage feedback amplifier with ultralow distortion, such as an AD8008 manufactured by Analog Devices™. However, in alternative embodiments of the invention, the operational amplifier may be configured utilizing a current feedback implementation. The closed-loop feedback path may also include exclusively small RF decoupling capacitors Cg_rf and Cd_rf (within the single picofarad range) within the loop, but much larger bulk capacitors (Cg_bulk, Cd_bulk) outside the loop, which operate to enhance TDD switching time (<<1 μs).

As described more fully hereinbelow, the closed-loop bias control circuit 10 is configured to regulate a magnitude of the bias control voltage Vgg to achieve a specific and substantially constant quiescent bias current (Idq) when the transmit/receive amplifier 12 is enabled, notwithstanding device, time and temperature variations. This bias current is provided through a sense resistor Rsense, which develops a sense voltage (Vsense), where Vsense=Idq(Rsense). When enabled, the transmit/receive amplifier 12 generates a radio frequency output signal OUT_RF in response to the radio frequency input signal IN_RF, during a TX or RX segment of a TDD time interval (see, e.g., FIG. 1B). In some embodiments of the invention, the transmit/receive amplifier 12 may be embodied as a gallium arsenide (GaAs) monolithic microwave integrated circuit (MMIC).

The bias control circuit 10 of FIG. 2B also includes a reference voltage generator, which is responsive to the "on/off" enable signal ENABLE. In this embodiment, the reference voltage generator is illustrated as including resistors R1, R2 and R3, and a high frequency switch having a control terminal that receives the enable signal ENABLE. This switch may be a single pole, double throw (SPDT) switch, such as an ADG726 CMOS low voltage 2.5 ohm Dual SPDT switch manufactured by Analog Devices™. When ENABLE=0, the switch configures the reference voltage generator as a first voltage divider containing a totem-pole arrangement of resistors R1 and R2, which are connected in series between a power supply signal line Vd (responsive to a power supply signal PS) and a reference signal line (e.g., GND). Alternatively, when ENABLE=1, the switch configures the reference voltage generator as a second voltage divider containing a totem-pole arrangement of resistors R1 and R3.

Based on this configuration, when ENABLE=0 the reference voltage generator generates a first reference voltage Vref1 at a reference terminal/node Vref, and when ENABLE=1, the reference voltage generator generates a second reference voltage Vref2 at the reference voltage terminal/node Vref, where Vref1>Vref2. As explained more fully hereinbelow, the generation of Vref1 operates via the closed-loop feedback path to disable (i.e., turn-off) the transmit/receive amplifier 12, whereas the generation of Vref2 operates via the closed-loop feedback path to enable (i.e., turn-on) the transmit/receive amplifier 12 so that any received radio frequency input signal IN_RF may be amplified.

As will be understood by those skilled in the art, the operational amplifier OE and the parallel RC damping circuit provided by Rfb and Cfb operate as an integrator (e.g., Miller integrator) within the closed-loop feedback path, which evaluates an error voltage (Verror) by comparing a reference voltage generated at the reference terminal/node Vref (and a "−" terminal of the operational amplifier OA) to a feedback voltage Vfb, which is provided to a "+" terminal of the operational amplifier OA. This feedback voltage Vfb is derived from a voltage at the current receiving terminal VD (and node Vdd) of the transmit/receive amplifier 12.

In particular, the feedback voltage divider, which is defined by feedback resistors R4 and R5, generates the feedback voltage Vfb as equivalent to Vdd(R5/(R4+R5)). This means a magnitude of the feedback voltage Vfb is proportional to the voltage Vdd at the current receiving terminal VD of the transmit/receive amplifier 12. Accordingly, the operational amplifier OE operates as a comparator within the closed-loop feedback path by comparing one of two reference voltages (Vref1 or Vref2), which is selectively generated at the reference terminal/node Vref, to the feedback voltage Vfb generated at an intermediate node of the feedback voltage divider.

Moreover, the serially-connected resistors R4 and R5 within the feedback voltage divider may be matched to resistors R1 and R2 within the second voltage divider so that R1=R4 and R2=R5. Based on these matched resistor values, Vfb will be driven to the same voltage as Vref1 and Vdd will be pulled high (in response to a reduction in Idq) to thereby approximate the voltage Vd on the power supply signal line when the "on/off" enable signal ENABLE is switched to a logic 0 value. The output terminal of the operational amplifier OA will also utilize the voltage division provided by resistors R6 and R7 within the bias control voltage divider and a magnitude of the bias control reference signal BIAS, to set a magnitude of the bias control voltage Vgg at two distinct voltage levels when the transmit/receive amplifier 12 is either disabled (ENABLE=0, Vref=Vref1) or enabled (ENABLE=1, Vref=Vref2).

Figure 3:
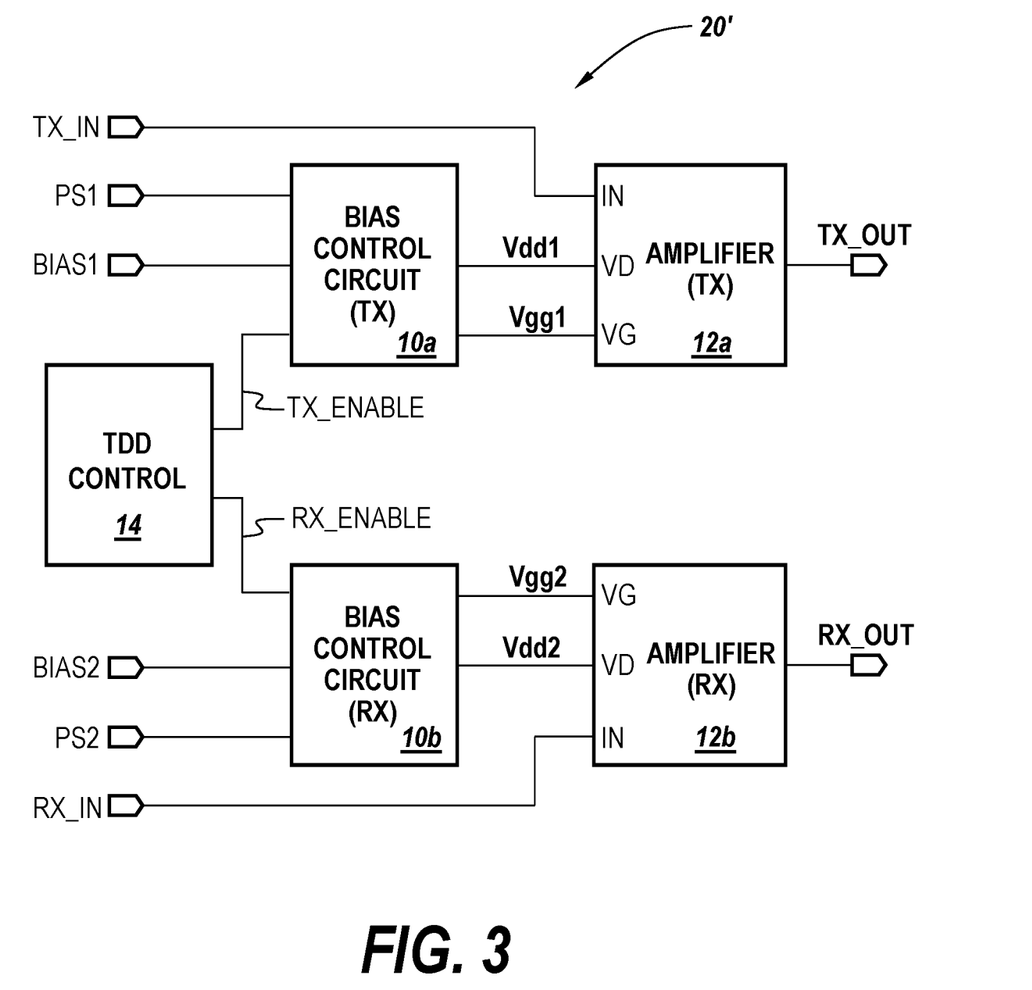
FIG. 3 is a block diagram of a pair of transmit (TX) and receive (RX) radio frequency communication circuits, which support time division duplexing (TDD) according to an embodiment of the present invention.

Referring now to FIG. 3, a pair of transmit (TX) and receive (RX) radio frequency (RF) communication circuits, such as those illustrated by FIGS. 2A-2B, may be utilized within a bidirectional time division duplexing (TDD) communication system 20' according to embodiments of the present invention. In this system 20', a first bias control circuit 10a provided in combination with an RF transmitter 12a (e.g., power amplifier (PA)) and a second bias control circuit 10b is provided in combination with an RF receiver 12b (e.g., low noise amplifier (LNA)), as illustrated. The RF transmitter 12a includes first and second input terminals, which are responsive to a first bias control voltage Vgg1 and an RF transmitter input signal (TX_IN), and an output terminal that generates an RF transmitter output signal (TX_OUT). The first bias control circuit 10a, which is shown in greater detail by the bias control circuit 10 of FIG. 2B, is responsive to a first power supply signal PS1, a first bias control reference signal BIAS1 and a transmitter enable signal TX_ENABLE. The first bias control circuit 10a also includes a first closed-loop feedback path extending between a current receiving terminal VD of the RF transmitter 12a, which receives the node voltage Vdd1, and the first input terminal VG of the RF transmitter 12a, which receives the first bias control voltage Vgg1. As described above with respect to FIGS. 2A-2B, this first closed-loop feedback path is configured to regulate a magnitude of the first bias control voltage Vgg1 when the RF transmitter 129a is enabled, to thereby support a substantially constant quiescent bias current.

Similarly, the RF receiver 12b includes first and second input terminals, which are responsive to a second bias control voltage Vgg2 and an RF receiver input signal (RX_IN), and an output terminal that generates an RF receiver output signal (RX_OUT). The second bias control circuit 10b, which is shown in greater detail by the bias control circuit 10 of FIG. 2B, is responsive to a second power supply signal PS2, a second bias control reference signal BIAS2 and a receiver enable signal RX_ENABLE. The second bias control circuit 10b also includes a second closed-loop feedback path extending between a current receiving terminal VD of the RF receiver 12b, which receives the node voltage Vdd2, and the first input terminal VG of the RF receiver 12b, which receives the second bias control voltage Vgg2. As described above with respect to FIGS. 2A-2B, this second closed-loop feedback path is configured to regulate a magnitude of the second bias control voltage Vgg2 when the RF receiver 12b is enabled, to thereby support a substantially constant quiescent bias current.

Referring again to FIG. 2B and the component values specified by Table 1, the operation of the radio frequency communication circuit 20 will now be described for the case where the amplifier 12 is a transmitter amplifier. As shown by Table 1, the reference voltage generator includes resistors R1, R2 and R3 having values of 10K, 8.2K and 6.8K ohms, respectively. Thus, for a power supply signal line voltage Vd of 6.8 Volts, Vref=Vref1=Verror(−)=3.06 Volts when ENABLE=0 ("Off") and Vref =Vref2=Verror(−)=2.75 Volts when ENABLE=1 ("On"):

Vref1=3.06=6.8(8.2/(10+8.2)) Volts; and

Vref2=2.75=6.8(6.8/(10+6.8)) Volts.

As will be understood by those skilled in the art, the operational amplifier OA will respond to these reference voltages at its Verror(−) input terminal by using the closed-loop feedback path to adjust (i.e., pull-down or pull-up) the magnitude of the bias control voltage Vgg (via resistor R6 within bias control voltage divider R6, R7) at the first input terminal VG of the transmitter amplifier 12. This upward/downward adjustment of Vgg will induce a corresponding upward/downward change in the quiescent current at the current receiving terminal VD of the transmitter amplifier 12, which will continue until a feedback voltage Vfb at the Verror(+) terminal of the operational amplifier OA matches Verror(−). Thus, when ENABLE=0, Vfb will be driven to 3.06 Volts, and when ENABLE=1, Vfb will be driven to 2.75 Volts. Then, assuming the feedback voltage divider resistors R4, R5 match R1, R2, respectively, the node voltage Vdd at the current receiving terminal VD of the transmitter amplifier 12 will be set to:

Vdd=(Vfb/R5)(R4+R5)=3.06(10+8.2)/8.2=6.79 Volts, for ENABLE=0; and

Vdd=(Vfb/R5)(R4+R5)=2.75(10+8.2)/8.2=6.10 Volts, for ENABLE=1.

Finally, the regulated quiescent current Idq provided to node Vdd will equal Vsense/Rsense, where Vsense equals Vd−Vdd:

Idq=(6.8−6.79)/0.8≈0, for ENABLE=0; and

Idq=(6.8−6.1)/0.8=875 mAmps, for ENABLE=1.

The operation of the radio frequency communication circuit 20 will now be described for the case where the amplifier 12 is a receiver amplifier. As shown by Table 1, the reference voltage generator includes resistors R1, R2 and R3 having values of 10K, 56K and 18K ohms, respectively. Thus, for a power supply signal line voltage Vd of 4.0 Volts, Vref=Vref1=Verror(−)=3.4 Volts when ENABLE=0 ("Off") and Vref=Vref2=Verror(−)=2.57 Volts when ENABLE=1 ("On"):

Vref1=3.4=4.0(56/(10+56)) Volts; and

Vref2=2.57=4.0(18/(10+18)) Volts.

As will be understood by those skilled in the art, the operational amplifier OA will respond to these reference voltages at its Verror(−) input terminal by using the closed-loop feedback path to adjust (i.e., pull-down or pull-up) the magnitude of the bias control voltage Vgg (via resistor R6 within bias control voltage divider R6, R7) at the first input terminal VG of the receiver amplifier 12. This upward/downward adjustment of Vgg will induce a corresponding upward/downward change in the quiescent current at the current receiving terminal VD of the receiver amplifier 12, which will continue until a feedback voltage Vfb at the Verror(+) terminal of the operational amplifier OA matches Verror(−). Thus, when ENABLE=0, Vfb will be driven to 3.4 Volts, and when ENABLE=1, Vfb will be driven to 2.57 Volts. Then, assuming the feedback voltage divider resistors R4, R5 match R1, R2, respectively, the node voltage Vdd at the current receiving terminal VD of the receiver amplifier 12 will be set to:

Vdd=(Vfb/R5)(R4+R5)=3.4(10+56)/56=4.0 Volts, for ENABLE=0; and

Vdd=(Vfb/R5)(R4+R5)=2.57(10+56)/56=3.03 Volts, for ENABLE=1.

Finally, the regulated quiescent current Idq provided to node Vdd will equal Vsense/Rsense, where Vsense equals Vd−Vdd:

Idq=(4.0−4.0)/14≈0, for ENABLE=0; and

Idq=(4.0−3.03)/14=69 mAmps, for ENABLE=1.

TABLE 1

| COMPONENT | TDD COMMUNICATION SYSTEM | |
| --- | --- | --- |
| | TX AMPLIFIER (HIGH POWER) | RX AMPLIFIER (LOW NOISE) |
| Rsense | 0.8Ω | 14Ω |
| R1 | 10KΩ | 10KΩ |
| R2 | 8.2KΩ | 56KΩ |
| R3 | 6.8KΩ | 18KΩ |
| R4 | 10KΩ | 10KΩ |
| R5 | 8.2KΩ | 56KΩ |
| R6 | — | 10Ω |
| R7 | — | 330Ω |
| Rfb | — | 1MΩ |
| Cfb | — | 1 pF |
| Cd_bulk | — | ~nF |
| Cd_rf | — | ≤10 nF |
| Cg_bulk | — | ~nF |
| Cg_rf | — | ≤100 pF |
| PARAMETER (ON/OFF) | | |
| Vd (Volts) | 6.8/6.8 | 4.0/4.0 |
| VBIAS (Volts) | — | −3.0 |
| Idq (mAmps) | 875/~0 | 69/~0 |
| Vdd (Volts) | 6.1/6.8 | 3.03/4.0 |
| Vref2/Vref1 (Volts) | 2.75/3.06 | 2.57/3.39 |
| Vsense (Volts) | 0.7/~0 | 0.97/~0 |
| Verror(+) (Volts) | 2.75/3.06 | 2.57/3.39 |
| Verror(−) (Volts) | 2.75/3.06 | 2.57/3.39 |

As will now be described with respect to FIGS. 4A-4B, the above-described advantages of the bidirectional (TDD) communication system 20 may be further enhanced by proper sequencing of the power supply signals PSn (PS1, PS2) for the transmitter and receiver amplifiers (PA, LNA), typically upon start-up. This sequencing can be performed to control: (i) the power supply inrush current to a specified maximum (for a defined capacitive load), and (ii) the "drain" voltage at the current receiving terminal (VD), until the bias control reference signals BIAS1, BIAS2 (and Vgg1, Vgg2) are fully presented and rendered stable. In particular, a pair of inrush current limiters 40 can be utilized to generate a corresponding pair of power supply signals PS1, PS2 and support the required sequencing of load currents (I_load) for each of the transmitter/receiver communication circuits shown in FIG. 3.

Figure 4A:
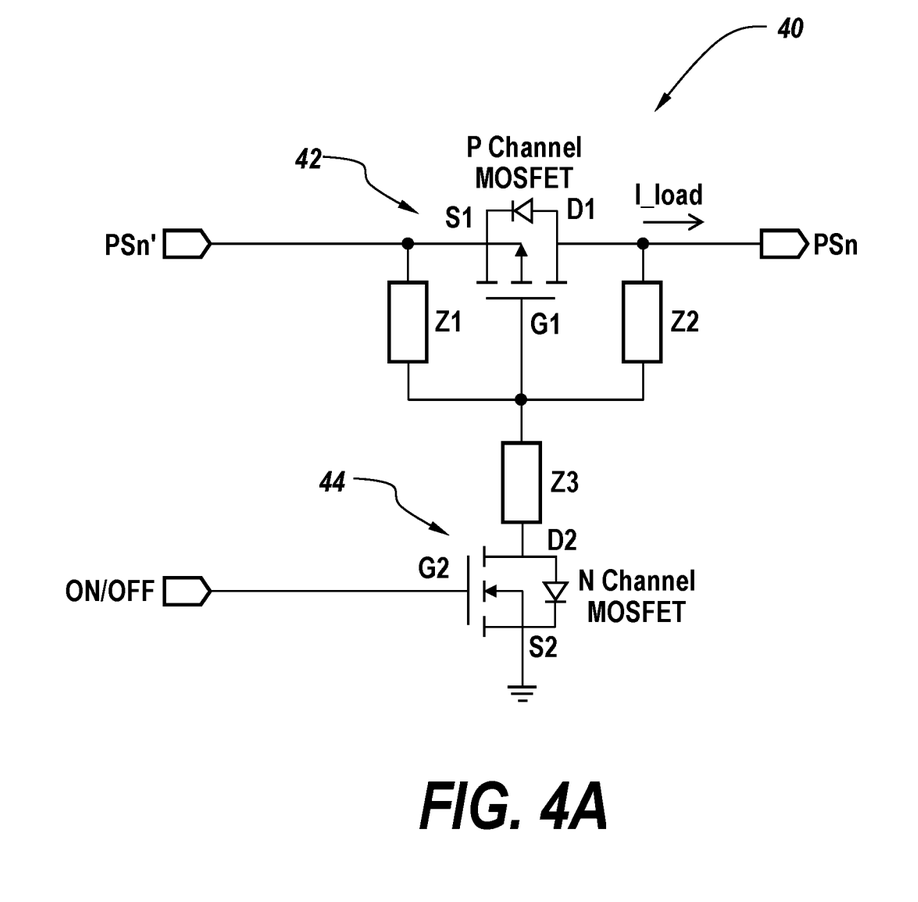
FIG. 4A is an electrical schematic of an inrush current limiter, which may be utilized to provide the power supply signals (e.g., PS, PS1, PS2) illustrated by FIGS. 2A-2B and 3, according to an embodiment of the present invention.

As shown by FIG. 4A, an inrush current limiter 40 may include an in-line current regulating switch 42, which is coupled to receive an input power supply signal PSn' at a fixed DC voltage. This in-line switch 42, which is illustrated as a P-channel enhancement mode MOSFET (PFET), has first and second current carrying terminals (e.g., source (S1), drain (D1)) and a control terminal (e.g., gate (G1)). This control terminal G1 is electrically coupled by a first impedance Z1 to the first current carrying terminal S1 and by a second impedance Z2 to the second current carrying terminal D1. An enable switch 44 may also be provided, which has a control terminal G2 responsive to a current control enable signal (ON/OFF) and a first current carrying terminal (e.g., drain (D2)) electrically coupled by a third impedance Z3 to the control terminal G1 of the current regulating switch 42. The enable switch 44 is illustrated as an N-channel enhancement mode MOSFET, which has a source terminal S2 connected to a ground reference potential.

The first and third impedances Z1, Z3 may be collectively configured to operate as a voltage divider when the current control enable signal is active (i.e., ON/OFF=1), yet clamp the current regulating switch 42 in a current blocking state when the current control enable signal is inactive (i.e., ON/OFF=0). In addition, the second and third impedances Z2, Z3 may be collectively configured to reduce a rate-of-change of a voltage (e.g., gate voltage) at the control terminal G1 of the current regulating switch 42 when the current control enable signal (ON/OFF) is switched from inactive to active to thereby turn on the inrush current limiter 40. According to some embodiments of the invention, the first and third impedances Z1, Z3 may be respective resistors and the second impedance Z2 may be a capacitor having a first current carrying terminal electrically coupled to the drain D1 of the P-channel MOSFET and a second current carrying terminal electrically coupled to the gate G1 of the P-channel MOSFET.

Figure 4B:
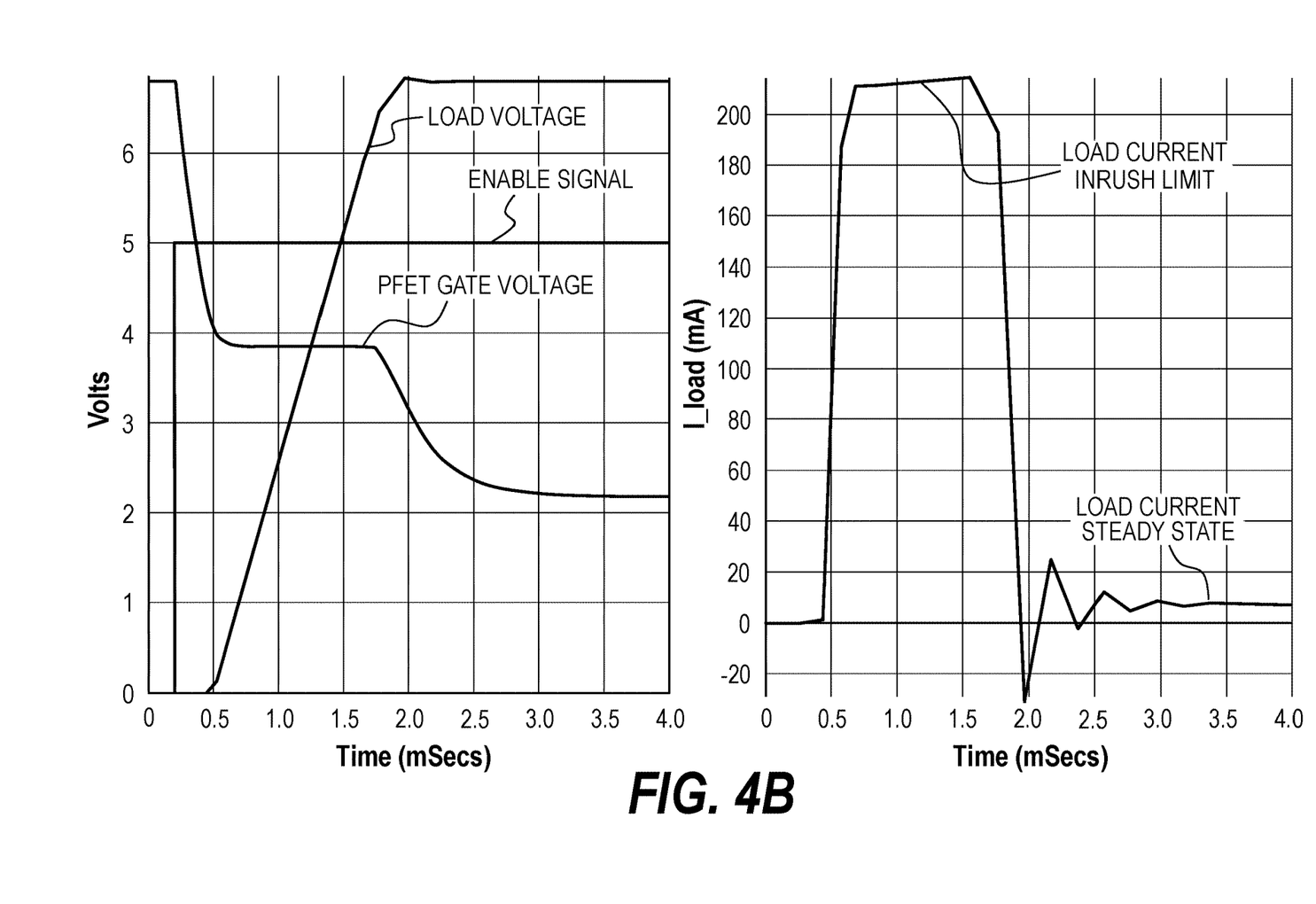
FIG. 4B illustrates two timing diagrams that highlight operation of the inrush current limiter of FIG. 4A, according to an embodiment of the present invention.

Referring now to the timing diagrams of FIG. 4B, at time equal to 0 milliseconds, the inrush current limiter 40 of FIG. 4A may be maintained in an "off" state by disposing the N-channel MOSFET (NFET) in a high impedance (i.e., high Z) state in response to setting the ON/OFF enable signal low (ON/OFF=0). During this "off" state, the load current I_load, which is illustrated by the graph on the right side of FIG. 4B, is clamped at 0 milliamps because the P-channel MOSFET (PFET) is held in a high impedance state. This high impedance state is responsive to the PFET gate voltage being held high, by Z1, at the voltage level of the input power supply signal PSn' (e.g., 6.8 Volts). Based on this high impedance state, the input power supply signal PSn' is prevented from reaching the load (i.e., power supply terminal PSn).

However, once the ON/OFF enable signal is switched low-to-high to turn on the NFET (e.g., after a corresponding bias control voltage Vgg1/Vgg2 is stable), the totem pole arrangement of Z1 and Z3, where Z1 and Z3 are both resistors, operates as a voltage divider to set the gate G1 of the PFET at a voltage necessary to turn on the PFET (i.e., Vgs is below the threshold voltage of the PFET). In response, a load voltage at the drain D1 of the PFET and the load current I_load will start to rise rapidly as the bulk capacitance associated with the load (i.e., Cd_bulk in FIG. 2B) starts to charge. In addition, because a series RC network may be provided by Z3 (resistor) and Z2 (capacitor), additional current will flow through Z3 until Z2 is fully charged. This additional current through Z3 will prevent the voltage at the gate G1 of the PFET from dropping too fast and thereby slow the full turn-on of the PFET, as shown by the graph of PFET gate voltage on the left side of FIG. 4B. Moreover, as shown by the graph on the right side of FIG. 4B, the inrush current levels are defined by the on-resistance of the PFET at the gate voltage G1, which is influenced by the additional downward current through Z3 (and NFET).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An inrush current limiter, comprising:
   a current regulating switch having first and second current carrying terminals and a control terminal, which is electrically coupled by a first impedance to the first current carrying terminal and by a second impedance to the second current carrying terminal; and
   an enable switch having a control terminal responsive to an enable signal and a first current carrying terminal electrically coupled by a third impedance to the control terminal of said current regulating switch.

2. The inrush current limiter of claim 1, wherein the first and third impedances are collectively configured to operate as a voltage divider when the enable signal is active.

3. The inrush current limiter of claim 2, wherein the first and third impedances are collectively configured to clamp the current regulating switch in a current blocking state when the enable signal is inactive.

4. The inrush current limiter of claim 3, wherein the second and third impedances are collectively configured to reduce a rate-of-change of a voltage at the control terminal of said current regulating switch when the enable signal is switched from inactive to active.

5. The inrush current limiter of claim 4, wherein said current regulating switch is a P-channel transistor and said enable switch is an N-channel pull-down transistor.

6. The inrush current limiter of claim 5, wherein the first and third impedances are resistors and the second impedance comprises a capacitor having a first current carrying terminal electrically coupled to a drain of the P-channel transistor and a second current carrying terminal electrically coupled to a gate of the P-channel transistor.

7. The inrush current limiter of claim 2, wherein the second and third impedances are collectively configured as a series R-C circuit when the enable signal is switch from inactive to active.

8. An inrush current limiter, comprising:
   a current regulating switch having first and second current carrying terminals and a control terminal, which is electrically coupled by a first impedance to the first current carrying terminal and by a second impedance to the second current carrying terminal; and
   an enable switch having a control terminal responsive to an enable signal, a first current carrying terminal electrically coupled to the control terminal of said current regulating switch, and a second current carrying terminal electrically coupled to a reference potential.

9. The inrush current limiter of claim 8, wherein the reference potential is a ground reference potential.

10. The inrush current limiter of claim 9, wherein the current regulating switch has a non-linear $V_{12}$ versus $I_{12}$ characteristic, where $V_{12}$ designates a voltage between the first and second current carrying terminals and $I_{12}$ designates a current passing between the first and second current carrying terminals.

11. An inrush current limiter, comprising:
a p-channel metal oxide semiconductor (PMOS) transistor;
a first impedance electrically coupled between a first current carrying terminal of said PMOS transistor and a gate terminal of said PMOS transistor;
a second impedance electrically coupled between a second current carrying terminal of said PMOS transistor and the gate terminal; and
an enable switch having a control terminal responsive to an enable signal, a first current carrying terminal electrically coupled by a third impedance to the gate terminal, and a second current carrying terminal electrically coupled to a reference potential.

12. The inrush current limiter of claim 11, wherein said enable switch is an n-channel metal oxide semiconductor (NMOS) transistor.

13. The inrush current limiter of claim 11, wherein said enable switch is an NMOS pull-down transistor; and wherein the reference potential is a ground reference potential.

* * * * *